(12) United States Patent
Won

(10) Patent No.: US 8,130,578 B2
(45) Date of Patent: *Mar. 6, 2012

(54) HIGH INTEGRATED OPEN BIT LINE STRUCTURE SEMICONDUCTOR MEMORY DEVICE WITH PRECHARGE UNITS TO REDUCE INTERFERENCE OR NOISE

(75) Inventor: Hyung-Sik Won, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 45 days.

This patent is subject to a terminal disclaimer.

(21) Appl. No.: 12/699,623

(22) Filed: Feb. 3, 2010

(65) Prior Publication Data

US 2010/0135094 A1 Jun. 3, 2010

Related U.S. Application Data

(63) Continuation of application No. 11/583,829, filed on Oct. 20, 2006, now Pat. No. 7,684,271.

(51) Int. Cl.
*G11C 7/00* (2006.01)
(52) U.S. Cl. ........ 365/203; 365/202; 365/206; 365/207; 365/208; 365/214

(58) Field of Classification Search ............ 365/202 X, 365/203 O, 206 X, 207 X, 208 X, 214 X, 365/202, 203, 206, 207, 208, 214
See application file for complete search history.

(56) References Cited

U.S. PATENT DOCUMENTS

| 4,484,312 | A | * | 11/1984 | Nakano et al. | 365/210.13 |
| 4,982,368 | A | * | 1/1991 | Arimoto | 365/206 |
| 5,062,079 | A | * | 10/1991 | Tsuchida et al. | 365/205 |
| 6,002,625 | A | * | 12/1999 | Ahn | 365/206 |
| 6,442,087 | B1 | * | 8/2002 | Morishima | 365/203 |
| 7,248,519 | B2 | * | 7/2007 | Kim | 365/203 |
| 7,327,610 | B2 | * | 2/2008 | Choi et al. | 365/185.25 |

* cited by examiner

*Primary Examiner* — VanThu Nguyen
(74) *Attorney, Agent, or Firm* — IP & T Group LLP

(57) ABSTRACT

A semiconductor memory device, having a 6F2 open bit line structure, connects each bit line of a bit line pair to a respective bit line of a neighboring bit line pair for a precharge operation so that a layout size of the semiconductor memory device decreases. Plural first precharge units each precharge one bit line of a first bit line pair and one bit line of a second bit line pair in response to a bit line equalizing signal. Plural sense amplifiers each sense a data bit supplied to a respective one of the first and second bit line pairs and amplify sensed data.

11 Claims, 3 Drawing Sheets

HIGH INTEGRATED OPEN BIT LINE STRUCTURE SEMICONDUCTOR MEMORY DEVICE WITH PRECHARGE UNITS TO REDUCE INTERFERENCE OR NOISE

This application is a continuation of U.S. patent application Ser. No. 11/583,829 filed on Oct. 20, 2006, now U.S. Pat. No. 7,684,271 which claims priority of Korean patent application number 10-2005-0099156 filed on Oct. 20, 2005. The disclosure of each of the foregoing applications is incorporated herein by reference in its entirety.

FIELD OF INVENTION

The present invention relates to a semiconductor memory device; and, more particularly, to a high integrated sense amplifier of which layout size can be reduced in a semiconductor memory device having an open bit line structure.

DESCRIPTION OF RELATED ARTS

Integration and capability of a semiconductor memory device is continuously being enhanced. There are two issues that are primarily addressed: increasing the speed at which the semiconductor memory device can operate, and increasing data storage capability of the semiconductor memory device in a restricted area.

As storage capacity of the semiconductor memory device increases, a larger area is required and/or higher integration. At issue for higher integration is how to make a minuter pattern in the semiconductor memory device. A fold bit line structure (generally, referred as to an 8F2 cell structure) and an open bit line structure (generally, referred as to a 6F2 cell structure) have been suggested. Generally, the 6F2 cell structure can decrease a chip size to about 25% to 30% less than the 8F2 cell structure.

FIG. 1 is a schematic circuit diagram of a sense amplifying block included in a conventional semiconductor memory device.

As shown, the sense amplifying block includes first and second precharge units 10 and 11, an equalizing unit 20, and a sense amplifier 30.

The first precharge unit 10 precharges a first bit line pair B1 and /B1 with a bit line precharge voltage VBLP in response to a bit line equalizing signal BLEQ. The precharge unit 10 includes two NMOS transistors T1 and T2. The bit line precharge voltage VBLP is supplied through commonly coupled drains of the NMOS transistors T1 and T2. The bit line equalizing signal BLEQ is input through gates of the NMOS transistors T1 and T2.

Similarly, the second precharge unit 11 includes two NMOS transistors T3 and T4 for supplying the bit line precharge voltage VBLP to a second bit line pair B2 and /B2 in response to the bit line equalizing signal BLEQ.

The equalizing unit 20 equalizes one of the first bit line pair, e.g., B1, with the other of the first bit line pair, e.g., /B1. The equalizing unit 20 connected between the first bit line pair B1 and /B1 includes NMOS transistor E1 having a gate receiving the bit line equalizing signal BLEQ.

The sense amplifier 30 comprises four MOS transistors. One of two PMOS transistors P1 and P2 and one of two NMOS transistors N1 and N2 are serially connected between a first sensing power line CSP and a second sensing power line CSN, and the other PMOS transistor and the other NMOS transistor are also serially connected between the first and second sensing power lines CSP and CSN. The sensing amplifier 30 senses a difference between voltage levels supplied on the first bit line pair B1 and /B1 and amplifies the difference by using voltages, e.g., VDD and GND, supplied through the first and second sensing power lines CSP and CSN.

As above described, the conventional sense amplifying block includes plural transistors. For reducing a size of a cell region including the conventional sense amplifying block, the semiconductor memory device, e.g., DRAM, having a 6F2 open bit line cell structure superior to an 8F2 cell structure is designed. In consideration of reducing chip size of the semiconductor memory device, a layout of the sense amplifying block is a main factor.

In the conventional sense amplifying block, the first bit line pair B1 and /B1 is precharged by the precharge unit 10 and the equalizing unit 20. If the conventional sense amplifying block is fabricated by the 6F2 open bit line cell structure, a first bit line B1 and a first bit line bar /B1 are respectively located in different mats located in opposite sides of the sense amplifier 30; thus, for connecting the first bit line B1 to the first bit line bar /B1, one of the first bit line B1 to the first bit line bar /B1 should be crossed on or under the sense amplifier 30.

Generally, in a semiconductor memory device, layout of the first bit line pair B1 and /B1 is limited. For example, intervals between the first bit line B1 and the first bit line bar /B1 and between the first bit line pair B1 and /B1 and a second bit line pair B2 and /B2, lengths of the first bit line pair B1 and /B1, or spaces between transistors and among the sense amplifier 30, the equalizing unit 20 and the precharge unit 10, are restricted in order to reduce interference or noise.

In the conventional sense amplifying block, a crossed bit line or crossed bit line bar described above can affect a layout pitch of the sense amplifying block; and, accordingly, size of the sense amplifying block cannot be further reduced due to the crossed bit line or crossed bit line bar.

SUMMARY OF THE INVENTION

It is an object of the present invention to provide a semiconductor memory device having a 6F2 open bit line structure which connects each of a bit line pair to each of a neighboring bit line pair for a precharge operation so that a layout size of the semiconductor memory device decreases.

In accordance with an aspect of the present invention, there is provided a semiconductor memory device, including plural first precharge units, each precharging one of a first bit line pair and one of a second bit line pair in response to a bit line equalizing signal and plural sense amplifiers, each sensing a data bit supplied to one of the first and second bit line pairs and amplifying a sensed data bit.

In accordance with another aspect of the present invention, there is provided a semiconductor memory device, including a first precharge unit for precharging one of a first bit line pair and one of a second bit line pair in response to a bit line equalizing signal, a second precharge unit for precharging the other of the first bit line pair and the other of the second bit line pair in response to the bit line equalizing signal, and a sense amplifier for sensing data supplied to each of the first and second bit line pairs and amplifying sensed data.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Hereinafter, a semiconductor memory device in accordance with specific embodiments of the present invention will be described in detail with reference to the accompanying drawings.

Figure 2:
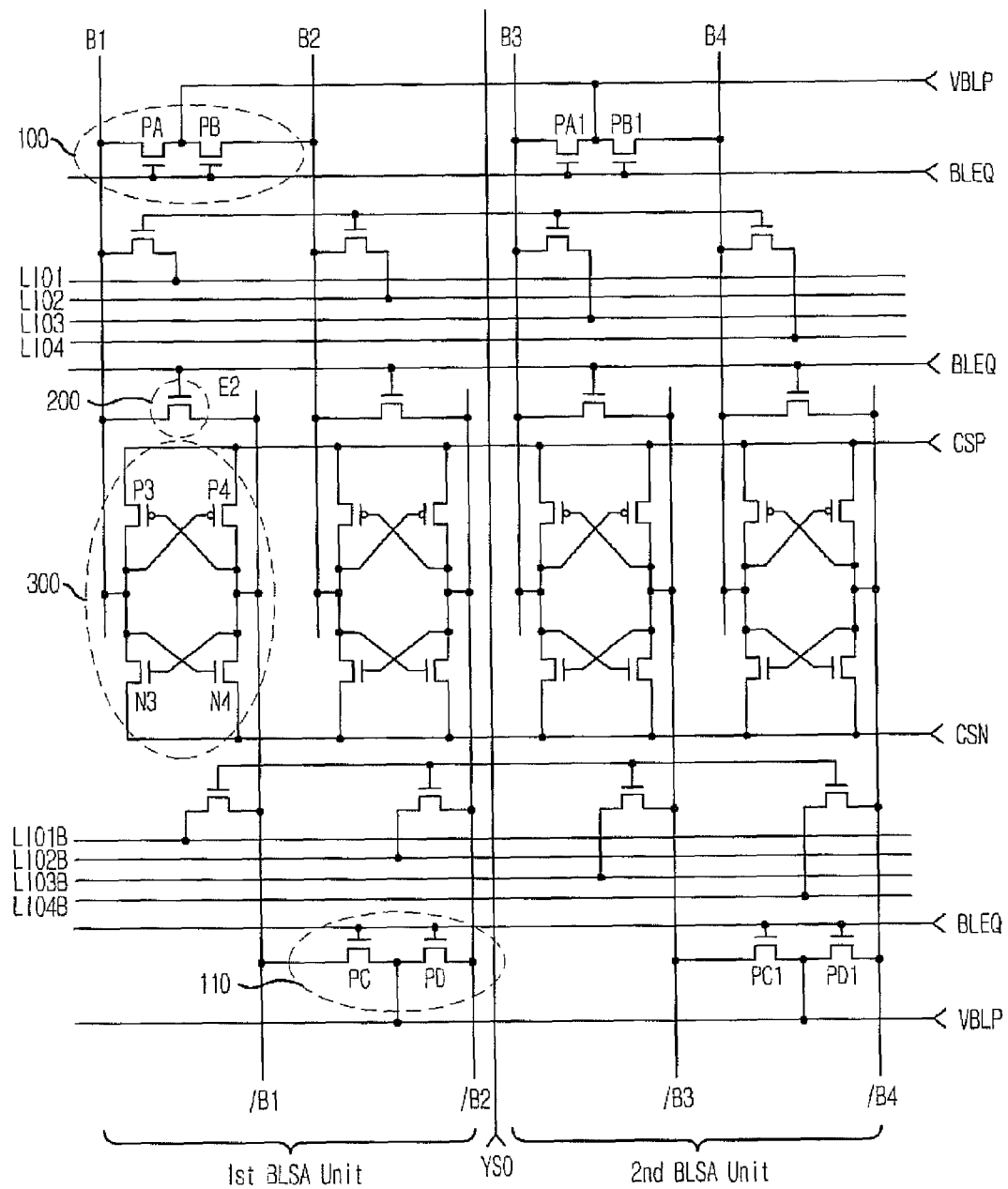
FIG. 2 is a schematic circuit diagram of a sense amplifying block included in a semiconductor memory device in accordance with the present invention.

FIG. 2 is a schematic circuit diagram of a sense amplifying block included in a semiconductor memory device in accordance with the present invention.

The sense amplifying block includes first and second precharge units 100 and 110, an equalizing unit 200, and a sense amplifier 300.

The first precharge unit 100 precharges one of a first bit line pair B1 and /B1 and one of a second bit line pair B2 and /B2 in response to a bit line equalizing signal VBLP. The second precharge unit 110 precharges the other of the first bit line pair B1 and /B1 and the other of the second bit line pair B2 and /B2 in response to the bit line equalizing signal VBLP. Particularly, in FIG. 2, the first precharge unit 100 precharges a first bit line B1 and a second bit line B2 and the second precharge unit 110 precharges a first bit line bar /B1 and a second bit line bar /B2. The first and second bit line pairs B1, /B1, B2, and /B2 lie adjacent to each other.

The first precharge unit 100 includes first and second NMOS transistors PA and PB for supplying a precharge voltage VBLP into each of the first bit line B1 and the second bit line B2 in response to the bit line equalizing signal BLEQ. The second precharge unit 110 includes third and fourth NMOS transistors PC and PD for supplying the precharge voltage VBLP into each of the first bit line bar /B1 and the second bit line bar /B2 in response to the bit line equalizing signal BLEQ. Herein, the precharge voltage VBLP is an internal voltage for maintaining the same voltage level of the bit line and bit line bar before and after a data access. As the precharge voltage VBLP, the semiconductor memory device can generally use a power voltage VDD, a ground voltage GND, and a half power voltage ½*VDD.

The equalization unit 200 equalizes voltage levels of one and the other of the first bit line pair B1 and /B1 in response to the bit line equalizing signal BLEQ. The equalization unit 200 includes a fifth NMOS transistor E2, connected between the first bit line B1 and the first bit line bar /B1, having a gate receiving the bit line equalizing signal BLEQ.

The sense amplifier 300 senses data supplied to each of the first and second bit line pairs B1, /B1, B2, and /B2 and amplifies sensed data. The sense amplifier 300 comprises four MOS transistors: one of two PMOS transistors P3 and P4 and one of two NMOS transistors N3 and N4 are serially connected between a first sensing power line CSP and a second sensing power line CSN, and the other PMOS transistor and the other NMOS transistor are also serially connected between the first and second sensing power lines CSP and CSN. Herein, a power voltage VDD or a high voltage having higher voltage level than the power voltage VDD is supplied through the first sensing power line CSP, and a ground voltage GND is supplied through the second sensing power line CSN.

The sensing amplifier 300 senses a difference between voltage levels supplied on the first bit line pair B1 and /B1 and amplifies the difference by using voltages, e.g., VDD and GND, supplied through the first and second sensing power lines CSP and CSN.

In the present invention having above described structure, the first bit line B1 and the second bit line 32 are coupled for a precharge operation by the first precharge unit 100. Likewise, the first bit line bar /B1 and the second bit line bar /B2 are coupled for the precharge operation by the second precharge unit 110.

When the sense amplifying block is fabricated by the 6F2 open bit line cell structure, a first bit line B1 and a first bit line bar /B1 are located in the same cell regions; accordingly, although the first bit line B1 is connected to the first bit line bar /B1, anyone of the first bit line B1 and the first bit line bar /B1 is not overlapped in the sense amplifier 300 and in a pitch between a bit line and a bit line bar. Thus, as compared with the conventional sense amplifying block, layout sizes of a bit line and a bit line bar can be reduced because the bit line or the bit line bar crossed into a sense amplifier for equalizing voltage levels of the bit line and the bit line bar can be removed. Accordingly, a total layout size of the sense amplifying block is also decreased.

Figure 1:
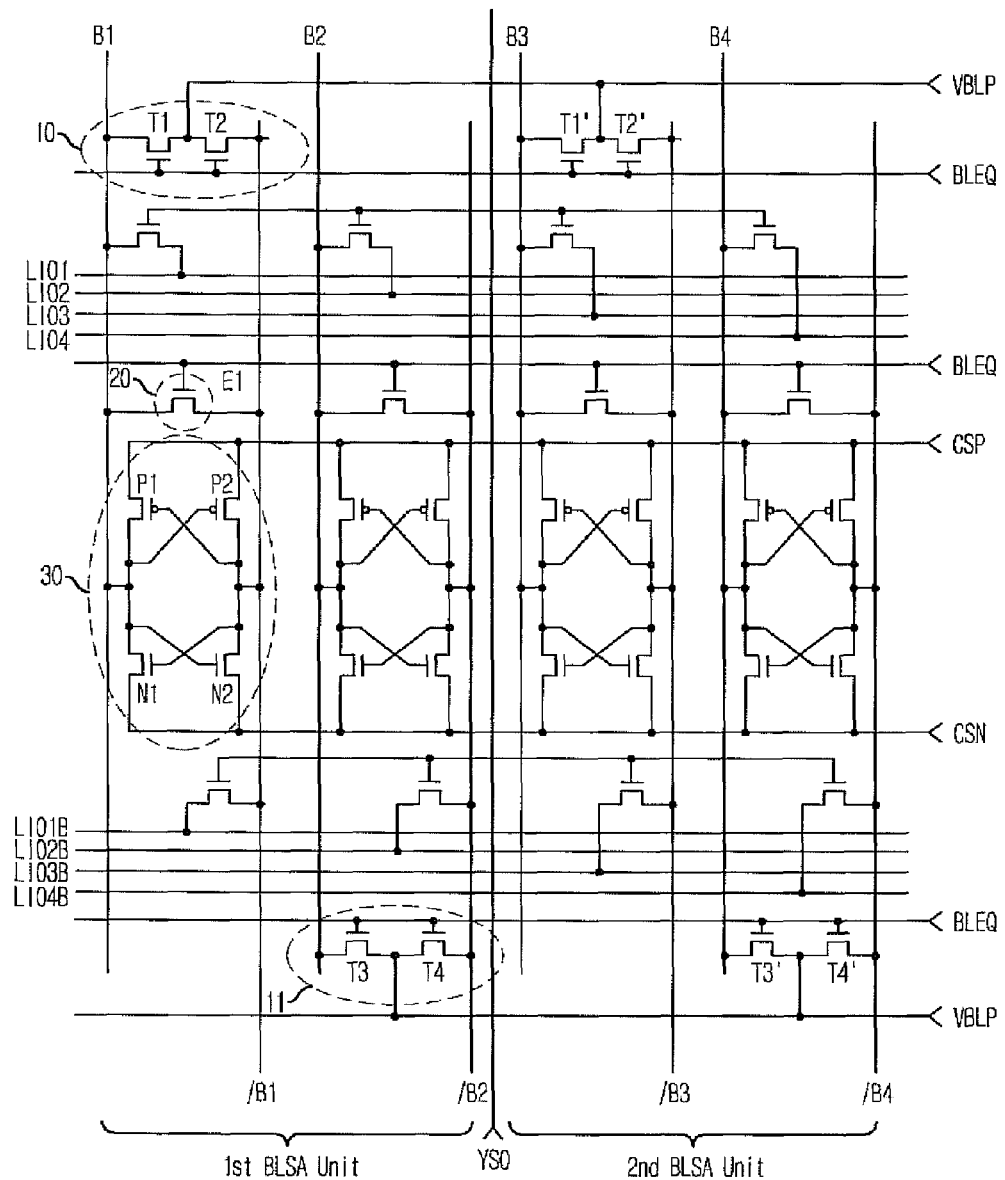
FIG. 1 is a schematic circuit diagram of a sense amplifying block included in a conventional semiconductor memory device.
Figure 3:
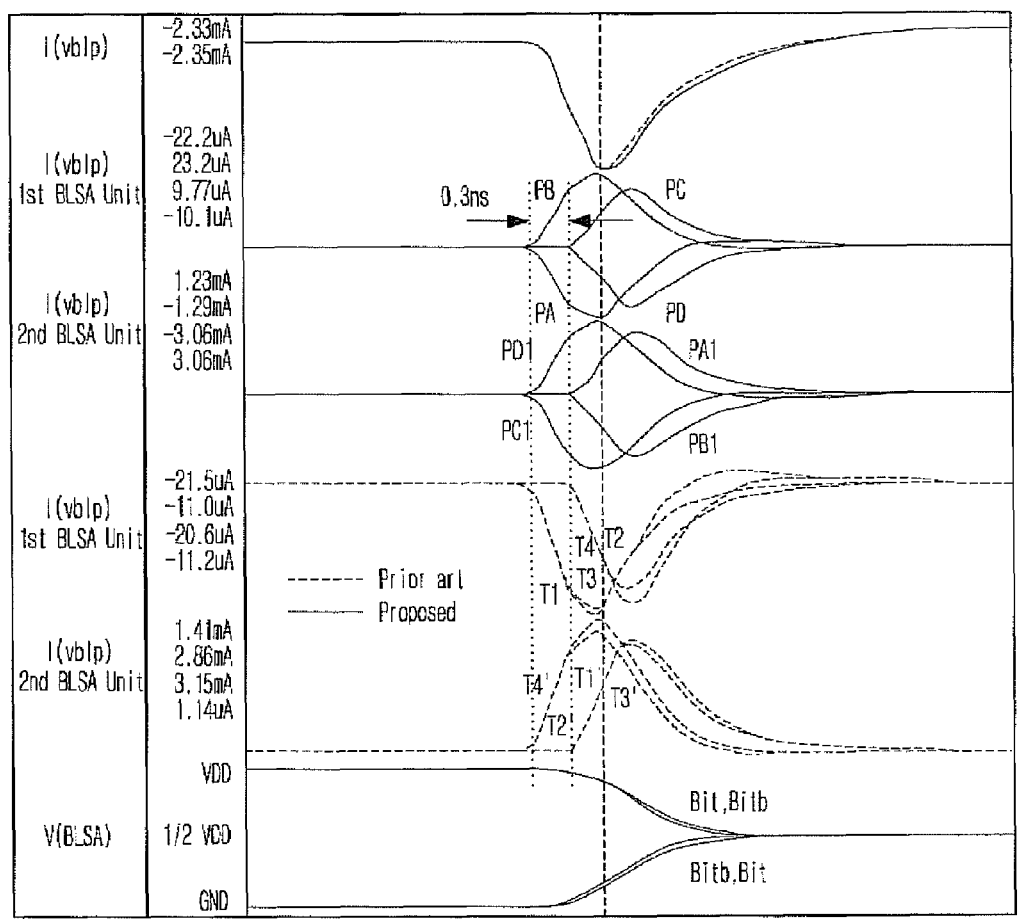
FIG. 3 is a graph showing a simulation result for comparing current consumptions between the sense amplifying blocks shown in FIGS. 1 and 2.

FIG. 3 is a graph showing a simulation result for comparing current consumptions between the sense amplifying blocks shown in FIGS. 1 and 2. Herein, the precharge voltage VBLP is a half power voltage ½*VDD.

Referring to FIG. 3, as compared with the conventional sense amplifying block, the sense amplifying block according to the present invention consumes similar amounts of current for the precharge operation. That is, the conventional precharge operation (i.e., the precharge voltage is supplied to the first bit line B1 and the first bit line bar /B1) is not different from the precharge operation according to the present invention (i.e., the precharge voltage is supplied to the first bit line B1 and the second bit line B2) in a view of current consumption. Accordingly, the present invention can not only reduce a layout of the sense amplifying block but also support an operation speed of the precharge operation and a voltage characteristic of the precharge voltage VBLP in the conventional sense amplifying block.

Further, since the first bit line B1 connected to the second bit line B2 is located over a core cell array, i.e., a cell region, a resistance of the first bit line B1 can be smaller than turn-on resistances of the first and second NMOS transistors PA and PB. Thus, the present invention does not affect a performance of the sense amplifying block and can decrease a layout size of the sense amplifying block.

As above described, the present invention reduces an overlap area in a pitch between a bit line and a bit line bar to decrease a layout size of the sense amplifying block.

The present application contains subject matter related to the Korean patent application No. KR 10-2005-0099156, filed in the Korean Patent Office on Oct. 20, 2005, the entire contents of which being incorporated herein by references.

While the present invention has been described with respect to certain specific embodiments, it will be apparent to those skilled in the art that various changes and modifications may be made without departing from the spirit and scope of the invention as defined in the following claims.

What is claimed is:

1. A semiconductor memory device, comprising:
   first and second bit line pairs, each of which includes first and second bit lines;
   a first sense amplifier configured to sense and amplify a data supplied from the first bit line pair;

a second sense amplifier configured to sense and amplify a data supplied from the second bit line pair;

a first precharge unit configured to precharge the first bit lines of the first and second bit line pairs in response to a bit line equalizing signal;

a second precharge unit configured to precharge the second bit lines of the first and second bit line pairs in response to the bit line equalizing signal;

a first equalization unit configured to equalize voltage levels of the first and second bit lines of the first bit line pair in response to the bit line equalizing signal: and a second equalization unit configured to equalize voltage levels of the first and second bit lines of the second bit line pair in response to the bit line equalizing signal, wherein the first and second bit lines are disposed in opposite directions based on each corresponding sense amplifiers.

2. The semiconductor memory device of claim 1, wherein the first precharge unit includes first and second switching elements for supplying the first bit lines of the first and second bit line pairs with a precharge voltage in response to the bit line equalizing signal.

3. The semiconductor memory device of claim 1, wherein the second precharge unit includes first and second switching elements for supplying the second bit lines of the first and second bit line pairs with a precharge voltage in response to the bit line equalizing signal.

4. The semiconductor memory device of claim 1, wherein the first and second bit line pairs are fabricated by a 6F2 open bit line structure.

5. A semiconductor memory device, comprising:
a first sense amplifier coupled to first and second bit lines;
a second sense amplifier coupled to third and fourth bit lines;
a first precharge unit coupled to the first and third bit lines;
a second precharge unit coupled to the second and fourth bit lines;
a first equalization unit configured to equalize voltage levels of the first and second bit lines in response to a bit line equalizing signal; and
a second equalization unit configured to equalize voltage levels of the third and fourth bit lines in response to the bit line equalizing signal.

6. The semiconductor memory device of claim 5, wherein the first precharge unit and the first and third bit lines coupled thereto are disposed in a first area; the first and second sense amplifiers are disposed in a second area; and the second precharge unit and the second and fourth bit lines coupled thereto are disposed in a third area, wherein the first and third areas are arranged in opposite directions based on the second area.

7. The semiconductor memory device of claim 5, wherein the first sense amplifier is configured to sense and amplify a first data supplied from the first and second bit lines and the second sense amplifier is configured to sense and amplify a second data supplied from third and fourth bit lines.

8. The semiconductor memory device of claim 5, wherein the first precharge unit is configured to precharge the first and third bit lines and the second precharge unit is configured to precharge the second and fourth bit lines in response to the bit line equalizing signal.

9. The semiconductor memory device of claim 5, wherein the first precharge unit includes first and second switching elements for supplying the first and third bit lines with a precharge voltage in response to the bit line equalizing signal.

10. The semiconductor memory device of claim 5, wherein the second precharge unit includes first and second switching elements for supplying the second and fourth bit lines with a precharge voltage in response to the bit line equalizing signal.

11. The semiconductor memory device of claim 5, wherein the first to fourth bit lines are fabricated by a 6F2 open bit line structure.

* * * * *